United States Patent
Rotondaro et al.

(10) Patent No.: US 7,449,385 B2
(45) Date of Patent: Nov. 11, 2008

(54) GATE DIELECTRIC AND METHOD

(75) Inventors: Antonio L. P. Rotondaro, Dallas, TX (US); Luigi Colombo, Dallas, TX (US); Douglas E. Mercer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1163 days.

(21) Appl. No.: 10/205,814

(22) Filed: Jul. 26, 2002

(65) Prior Publication Data

US 2004/0016973 A1 Jan. 29, 2004

(51) Int. Cl.
*H01L 21/336* (2006.01)
*H01L 21/3205* (2006.01)
*H01L 21/31* (2006.01)

(52) U.S. Cl. ............... 438/287; 438/591; 438/761; 438/762; 438/778

(58) Field of Classification Search ............... 438/287, 438/591, 761–763, 778
See application file for complete search history.

(56) References Cited

U.S. PATENT DOCUMENTS

| | | | |
|---|---|---|---|
| 6,479,404 B1 * | 11/2002 | Steigerwald et al. | 438/781 |
| 2003/0054669 A1 * | 3/2003 | Alluri et al. | 438/785 |
| 2003/0164525 A1 * | 9/2003 | Rotondaro et al. | 257/390 |

* cited by examiner

*Primary Examiner*—Hsien-ming Lee
(74) *Attorney, Agent, or Firm*—Jacqueline J. Garner; W. James Brady, III; Frederick J. Telecky, Jr.

(57) ABSTRACT

CMOS gate dielectric made of high-k metal silicates by reaction of metal with silicon dioxide at the silicon surface. Optionally, a silicon dioxide monolayer may be preserved at the interface.

9 Claims, 4 Drawing Sheets

GATE DIELECTRIC AND METHOD

CROSS-REFERENCE TO RELATED APPLICATIONS

The following patent applications disclose related subject matter: application Ser. No. 10/165,888, filed Jun. 10, 2002; Ser. No. 10/205,814, filed Jul. 26, 2002; Ser. No. 10/232,124, filed Aug. 30, 2002; Ser. No. 10/259,677, filed Sep. 27, 2002; and Ser. No. 10/349,686, filed Jan. 23, 2003. These applications have a common assignee with the present application.

BACKGROUND OF THE INVENTION

The present invention relates to semiconductor transistor fabrication and more particularly to complementary field effect transistors (CMOS) and integrated circuits containing them and methods of fabrication.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1-2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, (Ba, Sr)$TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $5\times10^{-6}$ mTorr and substrate temperature of 500° C.) of a 5 nm thick $Hf_6Si_{29}O_{65}$ ($Hf_{0.18}Si_{0.89}O_2$) layer directly onto silicon together with a gold top electrode deposition onto the silicate dielectric. Such capacitors showed low leakage current, thermal stability, an effective dielectric constant of about 11, and a breakdown field of 10 MV/cm.

However, high volume production of silicon integrated circuits with such high-k dielectrics have problems including deposition of high-k films for gate dielectric application by standard methods (CVD, PVD, ALD, etc) results on the formation of an $SiO_2$ layer at the interface between the deposited film and the substrate. This interface layer limits the scalability of the dielectric as it contributes to a significant part of the resulting effective oxide thickness.

SUMMARY OF THE INVENTION

The present invention provides integrated circuit fabrication including NMOS and PMOS devices having high-k gate dielectrics formed, at least in part, by reaction of metal with in situ silicon oxides.

This has the advantages of simple fabrication of CMOS devices having gate dielectrics made of high-k material.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits and MOS transistors include silicate high-k gate dielectrics fabricated with preferred embodiment methods which form a gate dielectric by reactions such as metal with a thin silicon oxide surface layer. This has benefits including elimination of low-k oxide-type interfacial layers, composition control of the interfacial layer, provision of a nucleation layer of tunable composition for subsequent high-k material deposition, and allowance for multicomponent/multilayered dielectric deposition.

2. First Preferred Embodiment Methods

FIGS. 1a-1j illustrate in cross sectional elevation views the steps of first preferred embodiment fabrication methods for integrated circuits including field effect transistors (e.g., CMOS or BiCMOS) with high-k gate dielectrics and polysilicon gates. The preferred embodiments include the following steps:

(1) Substrate

Figure 1A:
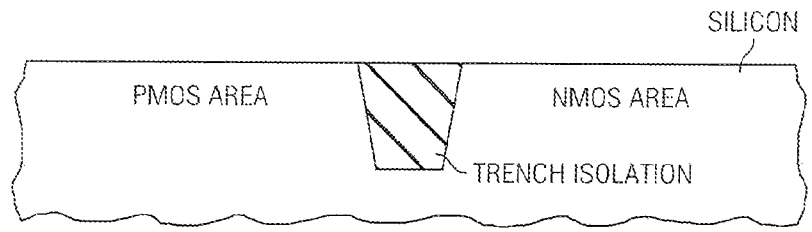
FIG. 1a shows in cross sectional elevation view a silicon substrate.

Start with a p-type silicon (or silicon-on-insulator) wafer with <100> orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punch-through deterrence regions, and threshold adjust regions. These implants are performed through the residual pad oxide.

Figure 1B:
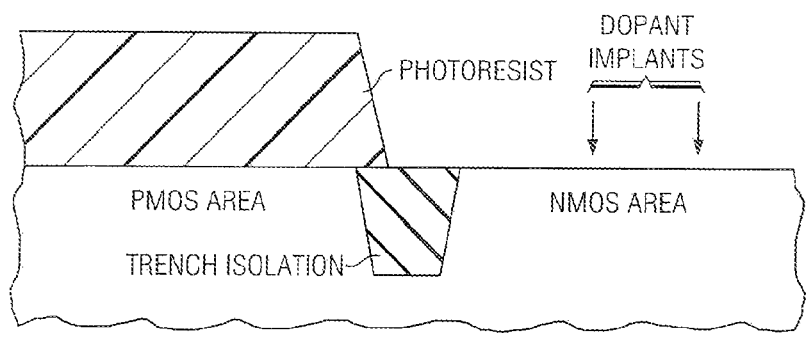
FIG. 1b shows in cross sectional elevation view implantation into a silicon substrate.

FIG. 1b illustrating the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) Gate Dielectric Formation

Form a high-k gate dielectric in two steps: first, form a thin silicon oxide passivation layer on the silicon surface, and second, deposit metal and react the metal with the thin oxide to consume the oxide and yield metal silicate dielectric directly on the silicon surface. Additional metal silicate deposition (CVD, PVD, ALD, etc.) may be used to thicken the dielectric layer.

Figure 1C:
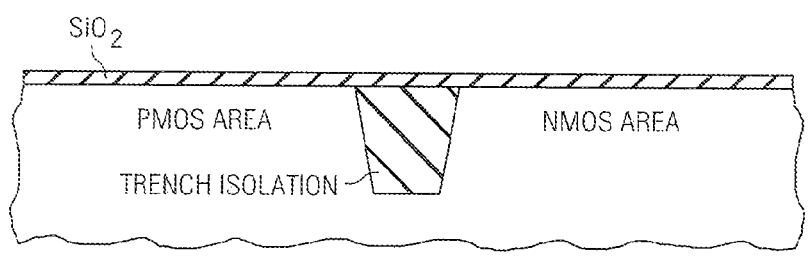
FIG. 1c shows in cross sectional elevation view a silicon oxide layer on a silicon substrate.

In particular, first oxidize the silicon surface in a $H_2SO_4$:$H_2O_2$:$H_2O$ solution to form a thin (e.g., 1.5 nm) dense chemical oxide; see FIG. 1c. This passivates the silicon surface. The oxidizing solution may be 78.4% $H_2SO_4$, 6.0% $H_2O_2$, and 15.6% $H_2O$ at 90° C., and the oxidation is self-limiting. Alternative self-limiting oxidations include use of a 30% $H_2O_2$ solution at 50° C. to yield 1.0 nm of oxide; ultraviolet light-activated oxygen at 250° C. and atmospheric pressure to yield 0.6 nm of oxide. Controlled oxidation at low pressure (<150 torr) in a rapid thermal tool in an ambient of $O_2$, $O_2$+$H_2$, $N_2O$+$H_2$, or NO+$H_2$ to grow 0.8 nm $SiO_2$ could also be used.

Figure 1D:
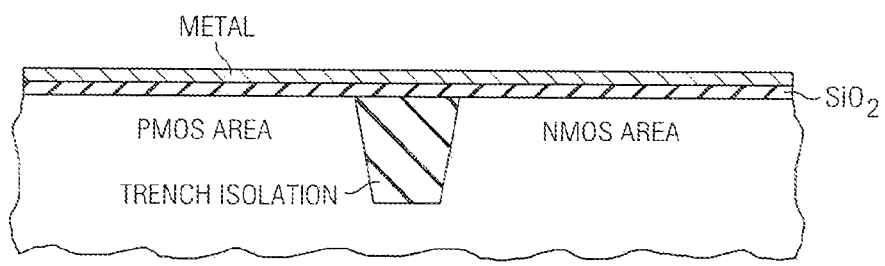
FIG. 1d shows in cross sectional elevation view a metal layer on a silicon oxide layer on a silicon substrate.
Figure 1E:
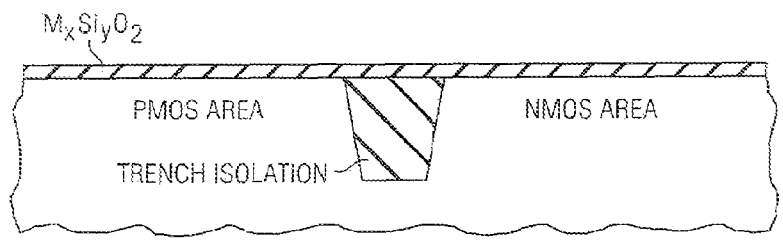
FIG. 1e shows in cross sectional elevation view a metal silicate gate dielectric layer on a silicon substrate.

Next, deposit a silicate precursor layer of metal, metal nitride, metal silicide or metal silicon nitride by sputtering, evaporation, CVD, LPCVD, ALD, etc. on the passivation oxide; see FIG. 1d. The metal can be Hf, Zr, Al, Ti, La, Pr, Y, Gd, Eu, Ta, or a compound or alloy like Ba—Sr—Ti. Control the deposited metal (metal nitride, metal silicide, metal nitride silicide) layer thickness so that the subsequent reaction (in a non-oxidizing atmosphere) with the passivation oxide will consume the oxide down to the silicon surface. The (unbalanced) reaction:

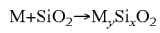

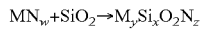

The final composition of the dielectric at the interface of high-k material and silicon can be tuned by controlling the relative thickness of the grown oxide to the deposited metal-based layer, the type of deposited silicate precursor layer (M, $M_xN_y$, $M_xSi_y$, $M_xSi_yN_z$) and the time/temperature of the subsequent anneal step.

Then react the metal (metal nitride, metal silicide, metal nitride silicide) with the passivation oxide by annealing in a non-oxidizing atmosphere such as argon. This is reaction yields about 1-3 nm of high-k dielectric, depending upon the original layer thicknesses; see FIG. 1e. If desired, the reaction can be performed in an oxidizing atmosphere, the competing direct oxidation of M on the surface would deter the consumption of the silicon dioxide down to the silicon surface and leave a silicon dioxide interfacial layer.

Alternatively, the reaction can be tuned (e.g., layer thicknesses) to leave just a monolayer of $SiO_2$ at the interface of the high-k dielectric and the silicon; this will guarantee high channel mobility of the silicon-oxide interface.

After the M-$SiO_2$ reaction, deposit more high-k dielectric by PVD, CVD, LPCVD, ALD, etc. to yield a final high-k gate dielectric thickness of 2.5-7 nm. The deposited high-k dielectric on top of the reaction-formed silicate layer can be a metal oxide, a metal oxinitride, a metal silicate, a metal silicon nitride, or even a high-k dielectric formed of totally different elements from the ones used to form the interfacial layer. The reaction-formed silicate provides a nucleation layer for the additional high-k dielectric, and thus when the additional high-k dielectric forms a large portion of the final gate dielectric, the reaction-formed silicate can be chosen to enhance the nucleation of the additional high-k dielectric.

The dielectric could be non-stoichiometric, such as $Hf_wSi_xO_y$, with y<2(w+x). Such a silicate has an effective dielectric constant of roughly 14, so a 7 nm thick silicate has an equivalent silicon dioxide thickness of 2 nm but not the leakage (tunneling) current of such a thin silicon dioxide gate dielectric. Also, after deposition the hafnium silicate dielectric layer could be nitrided and thereby compensate for oxygen vacancies. That is, the resultant dielectric material may generally be $Hf_wSi_xO_yN_z$ with the composition roughly stoichiometric but not easily crystallizable.

Figure 1F:
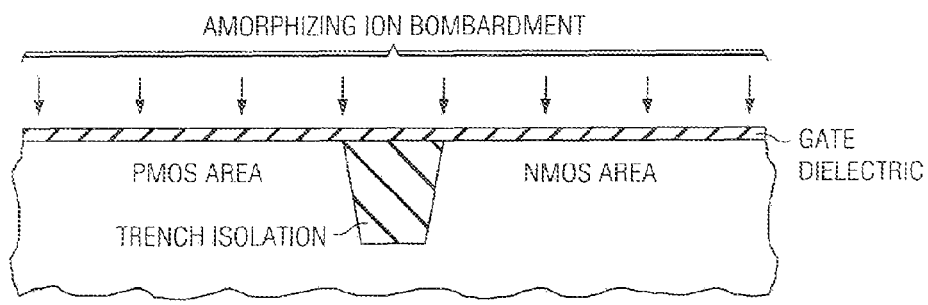
FIG. 1f shows in cross sectional elevation view an amorphizing ion bombardment of a gate dielectric layer on a silicon substrate.

Optionally, the amorphous character of the high-k gate dielectric layer may be ensured by a low energy ion implantation as illustrated in FIG. 1f. The ions may come from a plasma with bias on the order of 500 volts relative to the high-k gate dielectric.

After the deposition of the bulk high-k dielectric the dielectric stack (e.g., deposited high-k, reaction product silicate high-k, and silicon dioxide monolayer) can be treated in a combination of high temperature (>600° C.) anneal in non-oxidizing ambient aiming for material densification, and low temperature (<900° C.) anneal in oxidizing ambient aiming for reducing the number of defects in the stack and to eventually complete the desired stoichiometry of the films. These post-deposition treatments can include plasma excited species, ultraviolet light excited species, and even exposure to liquids of oxidizing behavior. Depending on the choice of post-deposition treatment, the anneal to react the first deposited layer with the grown $SiO_2$ film could be skipped and the reaction is accomplished during the stack post-deposition treatment.

(2') Split Gate Dielectric Option

Various integrated circuits include both high voltage and low voltage transistors; that is, MOS transistors with differing operating voltages such as differing maximum source-drain voltages and gate-source voltages. For example, a high voltage transistor could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (2) can provide for two or more transistor gate dielectric thicknesses through various approaches. For example, first grow a thin silicon dioxide layer; next, strip this oxide layer in areas for low voltage transistors; then perform passivation and silicate deposition of step (2) with silicate dielectric thickness targeted for the low voltage transistors. The unremoved initial grown oxide under the silicate dielectric in the areas for high voltage transistors provides the required extra dielectric thickness.

(3) Gate Material Deposition

Figure 1G:
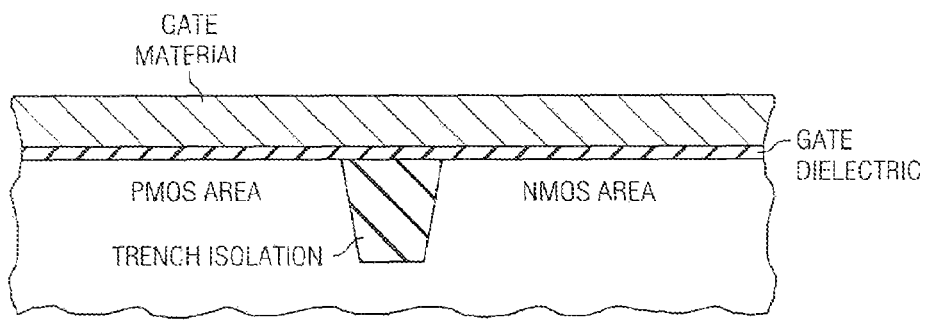
FIG. 1g shows in cross sectional elevation view a gate layer on a gate dielectric layer on a silicon substrate.
Figure 1H:
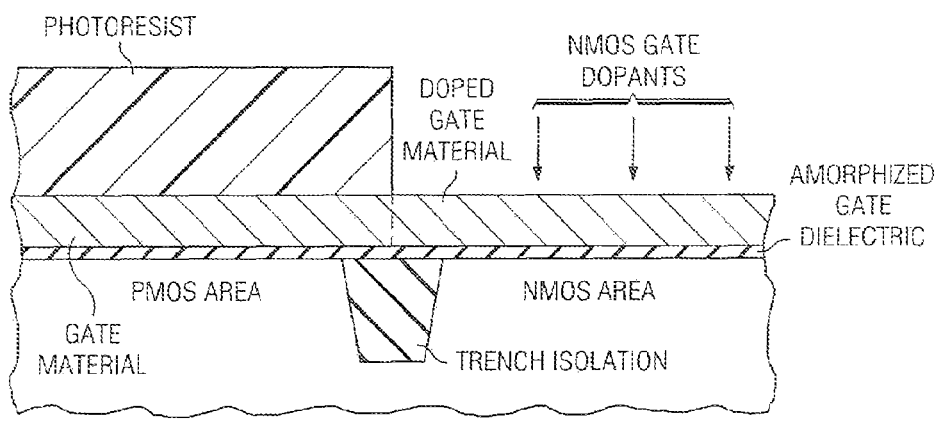
FIG. 1h shows in cross sectional elevation view an implantation into a gate layer on a gate dielectric layer on a silicon substrate.

Deposit a layer of amorphous silicon, polysilicon, or poly Si—Ge gate material of thickness 80-200 nm on the treated high-k gate dielectric; see FIG. 1g. The deposition may be low temperature decomposition of silane. Then dope the gate material n and p type in the NMOS and PMOS areas, respectively, by non-critical photoresist masking and dopant implantations; see FIG. 1h. (Polysilicon emitters for npn bipolars would be in the n type area.)

(4) Gate Mask and Etch

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop the photoresist and strip exposed ARC, if any.

Figure 1I:
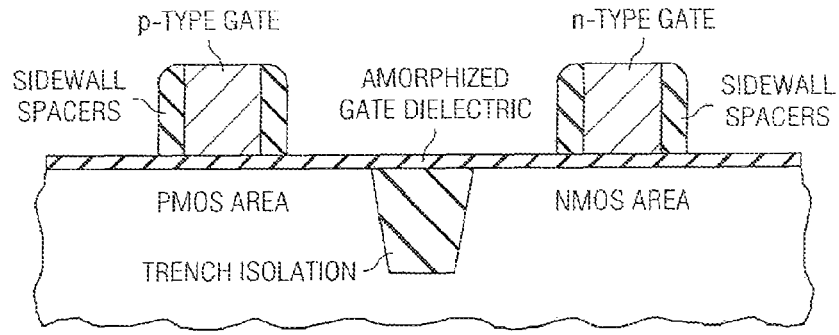
FIG. 1i shows in cross sectional elevation view gates on a gate dielectric layer on a silicon substrate.

Use the patterned photoresist as an etch mask for the anisotropic RIE or high-density plasma etch of the gate material (doped amorphous silicon) to form gates and gate level interconnects. The etch may be a two (or more) step process with an initial fast etch (such as a fluorine-based etchant source) followed by a chlorine or bromine-based etchant source which is selective to silicon dioxide and the high-k gate dielectric material; for example HBr plus oxygen. If the gate etch erodes the photoresist, the underlying ARC layer provides sufficient etch masking. Gates are 100 nm high and 30 nm long (FIG. 1i is a cross section along the gate length, and gates typically have widths much greater than their lengths).

(5) Source/Drains

Next, form sidewall spacers on the gates (and gate level interconnects) by a blanket conformal deposition of spacer material (such as 20 nm of silicon nitride or silicon dioxide) followed by anisotropic etch back to remove the spacer material from horizontal surfaces. FIG. 1i also illustrates the resulting sidewall spacers.

Implant dopants to form source/drain regions using the gates plus sidewall spacers as self-aligning masks. As before, use a non-critical mask on the NMOS regions during PMOS source/drains implant and a non-critical mask on the PMOS regions during NMOS source/drains implant. The exposed high-k gate dielectric material can first be etched off, or the implants can be through any exposed high-k gate dielectric material over the source/drain regions. For lightly-doped drains, use first implants after gate formation but prior to sidewall spacer formation.

(6) Interlevel Dielectric and Contacts

Figure 1J:
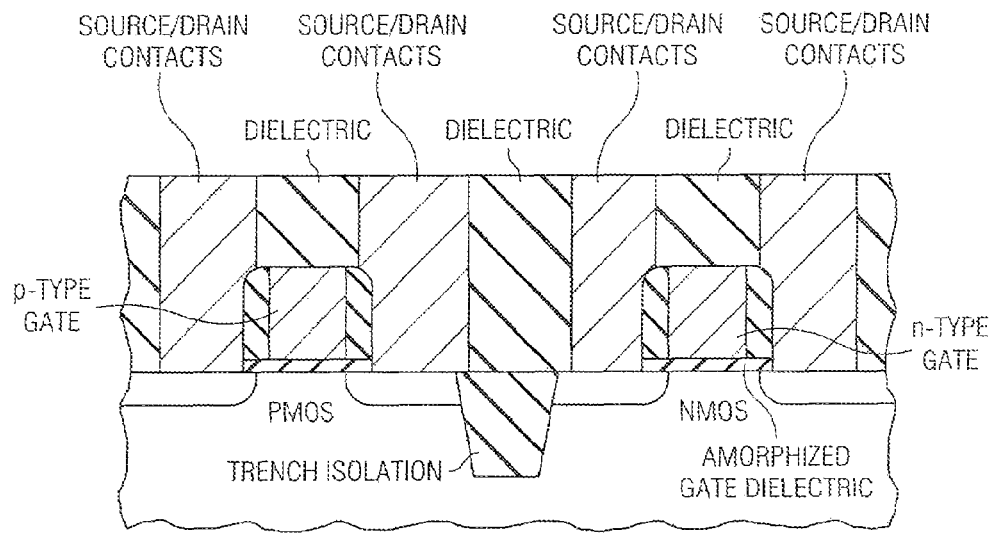
FIG. 1j shows in cross sectional elevation view a dielectric layer on field effect transistors with source/drain contacts through the dielectric layer.

FIG. 1j illustrates subsequent structure after deposition of a first interlevel dielectric and formation of contacts to source/drains. The integrated circuit fabrication continues with further levels of dielectrics and interconnects.

3. Clad Gates

Figure 2:
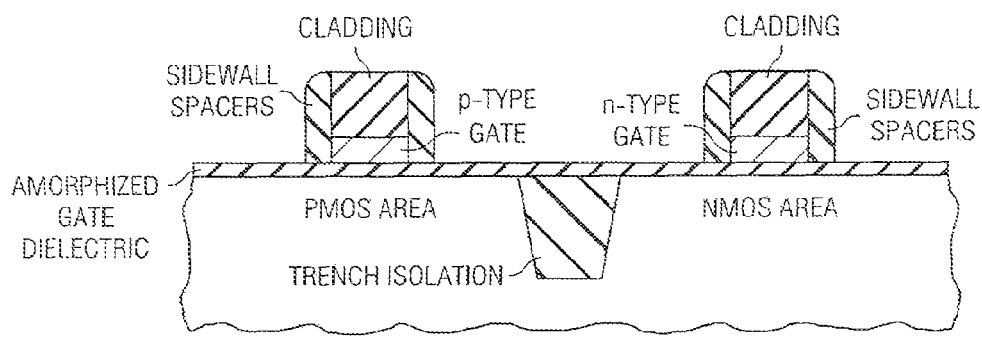
FIG. 2 shows in cross sectional elevation view a second preferred embodiment.

Further, the gates could be clad with a metal or metal silicide to increase conductivity; see FIG. 2.

4. Disposable Gate Preferred Embodiments

Figure 3A:
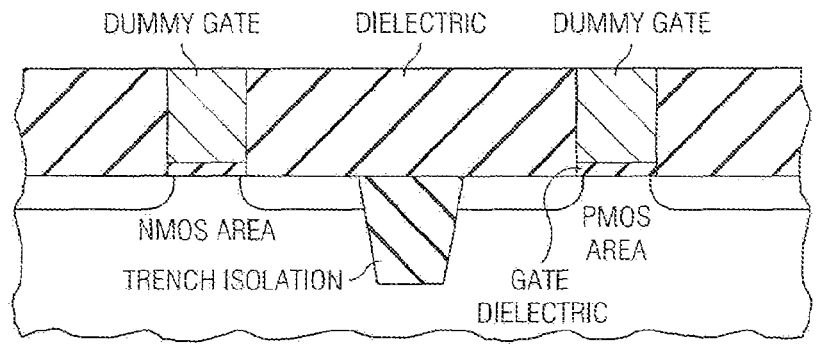
FIG. 3a shows in cross sectional elevation view a dielectric layer on field effect transistors with dummy gates on gate dielectric.
Figure 3B:
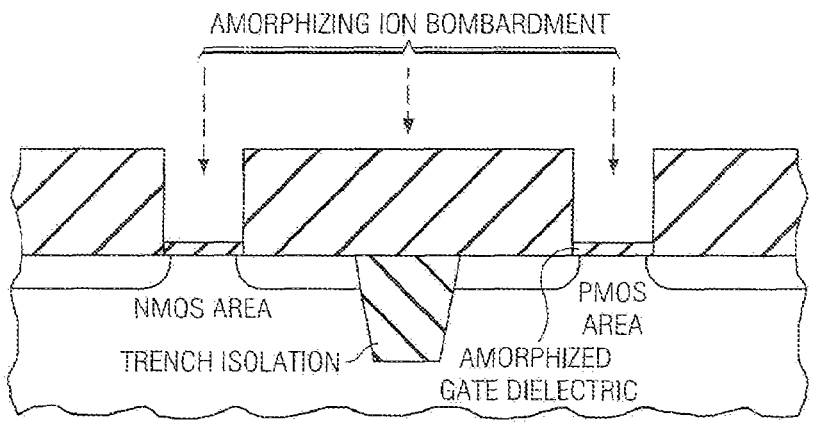
FIG. 3b shows in cross sectional elevation view a dielectric layer on field effect transistors after removal of dummy gates and amorphizing ion bombardment of exposed gate dielectric.
Figure 3C:
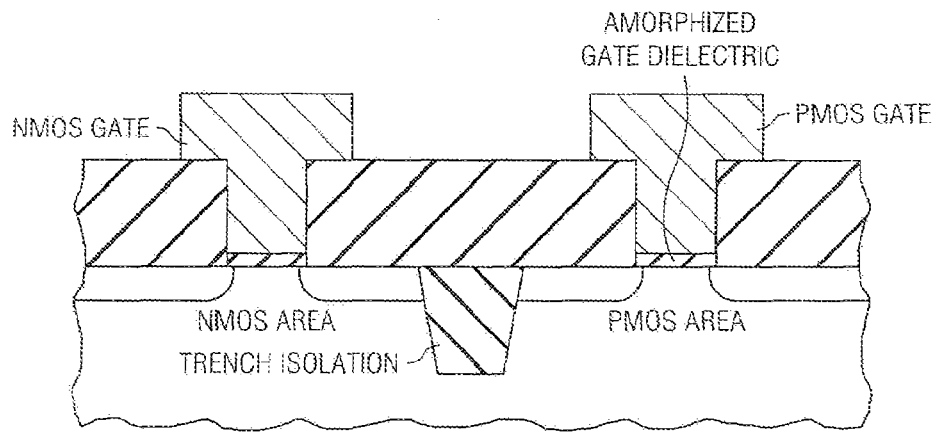
FIG. 3c shows in cross sectional elevation view a dielectric layer with field effect transistor gates extending through the dielectric layer.

FIGS. 3a-3c illustrate a preferred embodiment disposable (dummy) gate method of integrated circuit fabrication which uses a preferred embodiment high-k gate dielectric formation plus optional amorphization. In particular, follow the steps (1)-(5) of the foregoing preferred embodiment but without doping the polysilicon gate material to have a (undoped) polysilicon dummy gate (sidewall spacers have been omitted) and source/drains formed in the substrate. The high-k gate dielectric layer may have been amorphized as in step (2) or the amorphization may be deferred until after removal of the dummy gates or may be performed at both times.

Deposit 200-nm-thick interlevel dielectric (premetal dielectric), such as TEOS oxide, and planarize the resulting structure, such as by CMP, to expose the top of the polysilicon dummy gate. FIG. 3a shows dummy gates which may be about 200 nm high and 50 nm long.

Etch out the dummy gates with an HBr+$O_2$ plasma which stops on the gate dielectric layer to leave grooves in the premetal dielectric layer. The exposed high-k gate dielectric at the bottoms of the grooves can then be amorphized as illustrated in FIG. 3b.

Next, blanket deposit a gate material, such as polysilicon (or polysilicon plus metal (which may differ for NMOS and PMOS) for eventual silicidation) to fill the bottoms of the grooves plus cover the planarized dielectric; the gate material may be thin (e.g., 30-50 nm) for easy modification or thick (e.g., 50+nm) to form different work function gates for NMOS and PMOS, such as by non-critical patterning with photoresist and implanting.

Spin on and pattern photoresist to define a gate top of length 250 nm, and use the patterned photoresist to etch gate material to form T-shaped gate; see FIG. 3c.

Continue as in foregoing to form interlevel dielectrics and interconnects.

5. Modifications

The preferred embodiments can be modified in various ways while retaining the feature of high-k gate dielectric formation by reaction of metal with controlled thickness oxide.

What is claimed is:

1. A method of fabrication of filed effect devices, comprising the steps of:
   (a) forming a first layer of silicon oxide on a silicon surface;
   (b) depositing a second layer of silicate precursor material on said first layer of silicon oxide;
   (c) reacting said second layer of silicate precursor material with said first layer of silicon oxide to form a third layer of a silicate material;
   (d) forming gates on said third layer;
   wherein said reacting of step (c) consumes all of said first layer except for a monolayer of silicon dioxide at the interface with the silicon surface.

2. A method of fabrication of filed effect devices, comprising the steps of:
   (a) forming a first layer of silicon oxide on a silicon surface;
   (b) depositing a second layer of silicate precursor material on said first layer of silicon oxide;
   (c) reacting said second layer of silicate precursor material with said first layer of silicon oxide to form a third layer of a silicate material;
   (d) forming gates on said third layer;
   wherein after step (c), anneal to heal defects.

3. A method of fabrication of field effect devices, comprising the steps of:
   (a) forming a first layer of silicon oxide on a silicon surface;
   (b) depositing a second layer of silicate precursor material on said first layer;
   (c) reacting said second layer of silicate precursor material with said first layer to form a third layer of a silicate material;
   (d) depositing a fourth layer of dielectric material on said third layer; and
   (e) forming gates on said fourth layer.

4. The method of claim 3, wherein:
   (a) said reacting of step (c) of claim 3 consumes all of said first layer except for a monolayer of silicon dioxide at the interface with the silicon surface.

5. The method of claim 3, wherein:
   (a) after step (c) of claim 3, anneal to heal defects.

6. The method of claim 3, wherein:
 (a) said silicate precursor of step (b) of claim 3 is selected from the group consisting of Hf, Zr, Al, Ti, La, Pr, Y, Gd, Eu, Ta, and alloys thereof, and nitrides, silicides, and nitride-silicides thereof.

7. A method of fabrication of field effect devices, comprising the steps of:
 (a) forming a first layer of silicon oxide on a silicon surface;
 (b) depositing a second layer of silicate precursor material on said first layer;
 (c) depositing a third layer of dielectric material on said second layer;
 (d) annealing to react said second layer material with said first layer of silicon oxide to form a fourth layer of a silicate material; and
 (e) forming gates on said third layer.

8. The method of claim 7, wherein:
 (a) said annealing of step (d) of claim 7 consumes all of said first layer except for a monolayer of silicon dioxide at the interface with the silicon surface.

9. The method of claim 7, wherein:
 (a) said step (d) of claim 7 heals defects of the third and fourth layers.

* * * * *